United States Patent [19]

Yokogawa et al.

[11] Patent Number: 5,321,254
[45] Date of Patent: Jun. 14, 1994

[54] LIGHT-RECEIVING AND AMPLYFYING DEVICE CAPABLE OF WIDENING AN AC OPERATION RANGE

[75] Inventors: Naruichi Yokogawa, Kashihara; Naonori Okabayashi, Sakurai; Koichi Hanafusa, Kitakatsuragi, all of Japan

[73] Assignee: Sharp Kabushiki Kaisha, Osaka, Japan

[21] Appl. No.: 67,150

[22] Filed: May 26, 1993

[30] Foreign Application Priority Data

May 29, 1992 [JP] Japan .................................. 4-138473
Jan. 11, 1993 [JP] Japan .................................. 5-002536

[51] Int. Cl.[5] ............................................ H01J 40/14
[52] U.S. Cl. ................................. 250/214 R; 307/311
[58] Field of Search ............ 250/214 R, 214 A, 214.1; 307/311; 369/44.11, 48.35

[56] References Cited

U.S. PATENT DOCUMENTS 4,485,301 11/1984 Gontowski, Jr. et al. ...... 250/214 A
4,760,285 7/1988 Nelson ................................ 307/311

Primary Examiner—David C. Nelms
Assistant Examiner—K. Shami
Attorney, Agent, or Firm—Nixon & Vanderhye

[57] ABSTRACT

A light-receiving and amplifying device includes a plurality of photodiodes and amplifier circuits which receive inputs from anodes of the photodiodes. There is provided a first current mirror circuit for outputting a second current having the same magnitude as that of a first current which is a sum of currents flowing through cathodes of the photodiodes. Further provided is a second current mirror circuit which receives the second current from the first current mirror circuit and receives divided currents each having an even magnitude from the anodes of the photodiodes. An AC operation range of the light-receiving and amplifying device is widened in a simple manner at a low cost without significant dimensional increase of the device.

25 Claims, 14 Drawing Sheets

LIGHT-RECEIVING AND AMPLYFYING DEVICE CAPABLE OF WIDENING AN AC OPERATION RANGE

BACKGROUND OF THE INVENTION

1. Field of the Invention

The present invention relates to light-receiving and amplifying devices, and more particularly to a light-receiving and amplifying device having a photodiode and an amplifier circuit to be used as a constituent part of a pickup for a magneto-optic disc player, a mini-disc player, or the like.

2. Description of the Prior Art

Referring to FIG. 7, a conventional light-receiving and amplifying device of the above type is provided with four photodiodes PDA, PDB, PDC, and PDD having a common cathode and four amplifier circuits AMPA, AMPB, AMPC, and AMPD which receive photocurrent signals $I_{PDA}$, $I_{PDB}$, $I_{PDC}$, and $I_{PDD}$ from the anodes of the photodiodes PDA, PDB, PDC, and PDD. PDE indicates a parasitic photodiode. The amplifier circuits AMPA, AMPB, AMPC, and AMPD generate low-impedance voltage outputs $V_A$, $V_B$, $V_C$, and $V_D$. A pickup carries out signal processing operations such as a calculation operation based on the voltage outputs $V_A$, $V_B$, $V_C$, and $V_D$ to regenerate the data recorded on a disk (recording medium).

The above-mentioned photodiodes PDA, PDB, PDC, and PDD are fabricated in a N-type epitaxial layer 12 provided on a P-type semiconductor substrate 10 as shown in FIGS. 8 and 9 (where FIG. 8 shows a pattern layout, while FIG. 9 shows a cross-sectional construction). In more detail, four P-type diffusion layers 15, 16, 17, and 18 are formed on a surface of the N-type epitaxial layer 12, where the P-type diffusion layers 15, 16, 17, and 18 and the N-type epitaxial layer 12 constitutes the photodiodes PDA, PDB, PDC, and PDD. The above-mentioned N-type epitaxial layer 12 is separated from its periphery by means of a P-type isolation diffusion layer 13. It is noted that the reference numeral 11 denotes a N-type buried layer, and the reference numeral 14 denotes a N-type collector compensating diffusion layer. In the above-mentioned construction, there is the parasitic photodiode PDE between the common cathode of the photodiodes PDA, PDB, PDC, and PDD and the P-type semiconductor substrate 10 as shown in FIG. 9.

There are contained many DC light components in the input signal (representing light reflected on the disk) to the pickup. In the aforementioned conventional light-receiving and amplifying device, the photocurrent signals $I_{PDA}$, $I_{PDB}$, $I_{PDC}$, and $I_{PDD}$ containing the DC components are directly input to the amplifier circuits AMPA, AMPB, AMPC, and AMPD. The above-mentioned fact leads to a problem that the device has a narrow operation range of AC components. Particularly a pickup for a portable appliance is required to operate on a low voltage of 3 V, and therefore the AC operation range is further narrowed.

As a means for solving the above-mentioned problem, there can be considered a method of removing the DC components with provision of a high-pass filter circuit between the photodiodes PDA, PDB, PDC, and PDD and the amplifier circuits AMPA, AMPB, AMPC, and AMPD to let only the AC components pass. However, a pickup for use in an audio appliance is required to operate at a relatively low disk address signal frequency of about 22 kHz. Therefore, the above-mentioned high-pass filter circuit necessitates a capacitor having a large capacitance, which results in the dimensional increase of the device. Furthermore, when the photodiodes PDA, PDB, PDC, and PDD and the amplifier circuits AMPA, AMPB, AMPC, and AMPD are integrated in an identical chip, a complicated circuit results to increase the production cost.

SUMMARY OF THE INVENTION

Accordingly, it is an object of the present invention to provide a light-receiving and amplifying device capable of widening an AC operation range in a simple manner at low cost without any significant dimensional increase of the device.

In order to achieve the aforementioned object, there is provided a light-receiving and amplifying device having a plurality of photodiodes which generate current signals according to received light and amplifier circuits which are connected to anodes of the photodiodes to amplify the current signals generated by the photodiodes, the light-receiving and amplifying device comprising: a first current mirror circuit which is connected to cathodes of the photodiodes and outputs a first current having magnitude of at least a sum of currents flowing through the cathodes and outputs a second current having the same magnitude as the magnitude of the first current; and a second current mirror circuit which receives the second current output from the first current mirror circuit and receives divided currents each having equal magnitude from the anodes of the photodiodes.

It is preferable that the photodiodes have the anodes thereof formed by diffusing an impurity on a surface of a semiconductor layer to be a common cathode.

Further, it is preferable that the photodiodes and the amplifier circuits are formed on an identical semiconductor substrate.

Furthermore, it is preferable that the second current mirror circuit comprises a first transistor which receives the second current from the first current mirror circuit and a second transistor which is provided for each of the photodiodes with its base and emitter terminals connected respectively to base and emitter terminals of the first transistor, and the ratio of an emitter area of the first transistor to an emitter area of the second transistor is set at a specified ratio.

Moreover, it is preferable that the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

It is preferable that the switch is composed of a transistor.

Further, it is preferable that the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

In the present invention, the first current which is the sum of the currents flowing through the cathodes of the photodiodes is output by the first current mirror circuit. The first current is divided into divided currents each having an even magnitude for each photodiode by the second current mirror circuit, and the divided currents each having the even magnitude are removed from the anodes of the photodiodes. With the above-mentioned arrangement, DC components contained in the current input to the amplifier circuits are reduced to increase the rate of AC components. Therefore, an AC operation range of each of the amplifier circuits is widened as compared with the conventional case. The above-mentioned first and second current mirror circuits can be each composed only of transistors without using such a device as a capacitor having a large capacitance. Therefore, the light-receiving and amplifying device of the present invention can be produced in a simple manner at a low cost without dimensional increase of the device.

When the photodiodes have the anodes thereof formed by diffusing an impurity on the surface of the semiconductor layer to be the common cathode, the photodiodes are formed in a small area on a semiconductor substrate.

When the above-mentioned photodiodes and amplifier circuits are formed on an identical semiconductor substrate, the entire device can be constructed compactly.

The aforementioned second current mirror circuit includes a first transistor for receiving the second current from the aforementioned first current mirror circuit and a second transistor provided for each of the photodiodes with its base and emitter terminals connected respectively to the base and emitter of the first transistor. When the ratio of the emitter area of the first transistor to the emitter area of the second transistor is set at a specified ratio, the level of the divided current to be removed from the anodes of the photodiodes is adjusted. Therefore, the current input to each of the aforementioned amplifier circuits contains mostly the AC components to further widen the AC operation range.

Generally in a mini-disc player commonly for recording and playback use, the quantity of light received by the photodiodes greatly differs in the recording time and the playback time, and practically the light reception quantity in playback time is about one tenth of the light reception quantity in the recording time. Therefore, when the first and second current mirror circuits are incorporated in a manner as described above, the C-to-N ratio (Carrier-to-Noise ratio) deteriorates in the playback time to possibly deteriorate the jitter characteristic (fluctuation in the time axis direction) of an audio signal (RF signal). Therefore, in the present invention, the first current mirror circuit is composed of a third transistor for supplying a first current to the cathodes of the photodiodes and a fourth transistor of which base and emitter are connected respectively to the base and emitter of the third transistor to output from its collector a second current having the same magnitude as the first current output from the third transistor. Furthermore, a switch which can be externally controlled to be turned on and off is connected across the base terminals and the emitter terminals of the third and fourth transistors. When the above-mentioned arrangement is selected, the first current mirror circuit can be controlled to effect and stop its operation by an external control signal. In more detail, the aforementioned switch is turned off in the recording time. By so doing, the first current mirror circuit operates in a manner as described above to widen the AC operation range of the amplifier circuits. In the above case, the quantity of light received by the photodiodes is great, and therefore the provision of the first and second current mirror circuits does not matter in regard to the C-to-N ratio. In the playback time, the aforementioned switch is turned on. By so doing, the path across the base terminals and the emitter terminals of the third and fourth transistors is short-circuited to stop the operations of the transistors, with which the output currents of the first current mirror circuit are made to be approximately zero. Therefore, the C-to-N ratio of the RF signal is prevented from deteriorating to prevent the deterioration of the jitter characteristic. In the above case, the quantity of light received by the photodiodes is small, and therefore the AC operation range of each of the amplifier circuits is not required to be widened. When a switch is provided across the base terminals and the emitter terminals of the first and second transistors, the second current mirror circuit effects and stops its operation by turning on and off the switch. Therefore, by turning off the switch in the recording time and turning on the switch in the playback time, the AC operation range of the amplifier circuits can be widened in the recording time, and the C-to-N ratio of the RF signal can be prevented from deteriorating in the playback time to prevent the deterioration of the jitter characteristic in the same manner as the first current mirror circuit is controlled to effect or stop its operation. When switch units are provided both across the base terminals and the emitter terminals of the third and fourth transistors and across the base terminals and the emitter terminals of the first and second transistors, the AC operation range of each of the amplifier circuits is of course widened in the recording time, and the C-to-N ratio of the RF signal is prevented from deteriorating in the playback time to prevent the deterioration of the jitter characteristic.

When the above-mentioned switch is composed of a transistor, the switch can be produced simultaneously with the other constituent parts by a specified production process. Therefore, the switch can be provided in a simple manner.

It is of course permitted that an electric resistor having a specified resistance value (assumed to be R1) may be connected instead of the above-mentioned switch. It is assumed now that the electric resistor is connected to the first current mirror circuit and each of the third and fourth transistors has a cutoff voltage of $V_{BE}$ (about 0.5 V). When the quantity of light received by the photodiodes is sufficiently great in the recording time and therefore a first current I1 output to the cathodes of the photodiodes by the above-mentioned first current mirror circuit satisfies the condition as follows:

$$I1 > V_{BE}/R$$

a second current I2 of the first current mirror circuit is:

$$I2 \approx I1 - V_{BE}/R$$

Then the second current mirror circuit respectively receives divided currents having an equal magnitude from the anodes of the photodiodes. The sum of the divided currents equals the second current. By so doing, the DC components contained in the current to be input to each of the amplifier circuits are reduced to increase the rate of the AC components. Therefore, the AC operation range of each of the amplifier circuits is widened as compared with the conventional case. When the quantity of light received by the photodiodes is small in the playback time and therefore the first current I1 input to the cathode of each of the photodiodes by the above-mentioned first current mirror circuit satisfies the condition as follows:

$$I1 \leq V_{BE}/R$$

since the third and fourth transistors are cut off, the second current I2 of the first current mirror circuit is:

$$I2 \approx 0$$

which means that the first current mirror circuit stops its operation. Therefore, the C-to-N ratio of the RF signal is prevented from deteriorating to prevent the deterioration of the jitter characteristic. When the electric resistor is provided across the base terminals and the emitter terminals of the first and second transistors, the aforementioned second current mirror circuit effects or stops its operation according to the quantity of light received by the photodiodes. Therefore, the AC operation range of each of the amplifier circuits can be widened in the recording time, and the C-to-N ratio of the RF signal is prevented from deteriorating in the playback time to prevent the deterioration of the jitter characteristic in the same manner as the aforementioned first current mirror circuit is controlled to effect or stop its operation. When electric resistors are provided both across the base terminals and the emitter terminals of the third and fourth transistors and across the base terminals and the emitter terminals of the first and second transistors, the AC operation range of each of the amplifier circuits is of course widened in the recording time, and the C-to-N ratio of the RF signal is prevented from deteriorating in the playback time to prevent the deterioration of the jitter characteristic.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes in detail the light-receiving and amplifying device of the present invention based on several embodiments.

Figure 1:
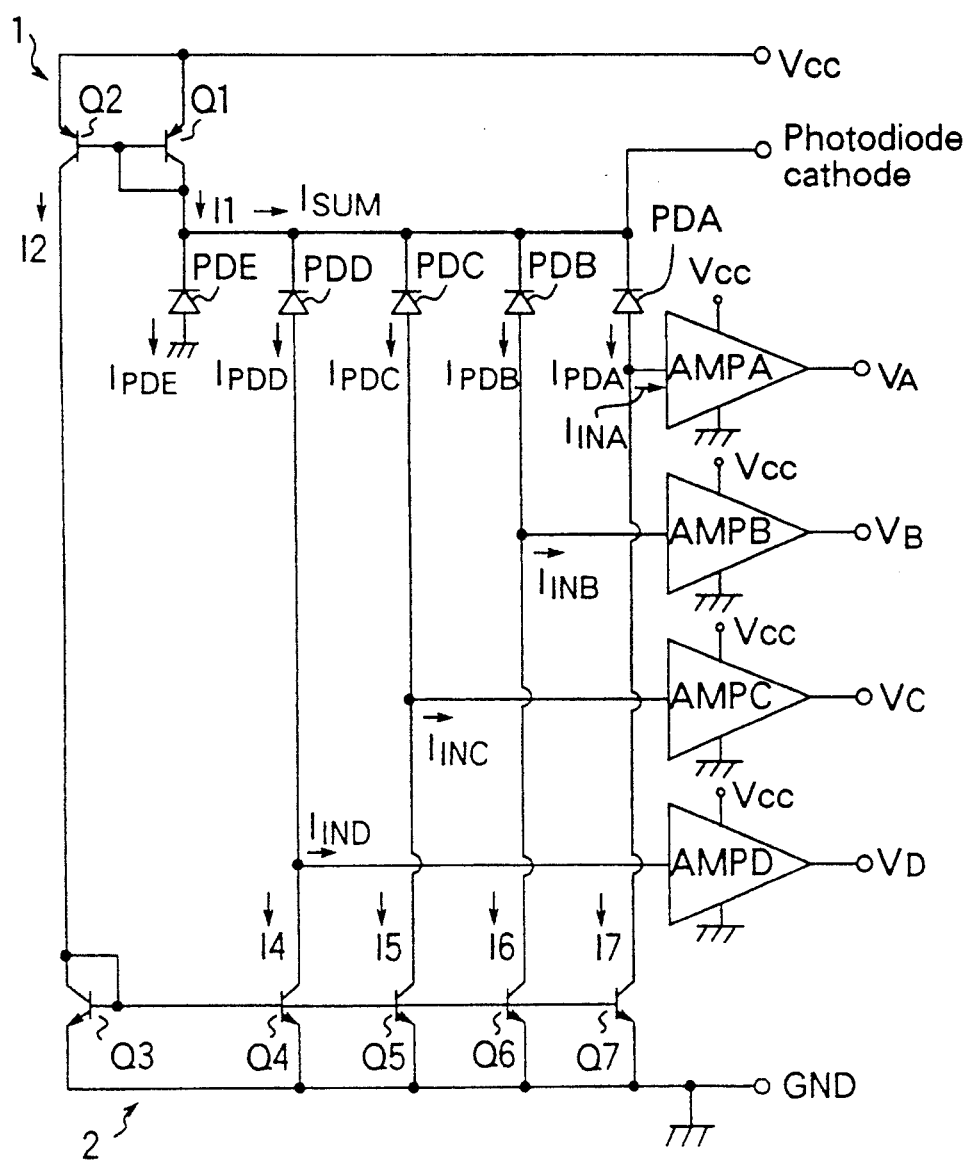
FIG. 1 is an equivalent circuit diagram of a light-receiving and amplifying device in accordance with an embodiment of the present invention.
Figure 7:
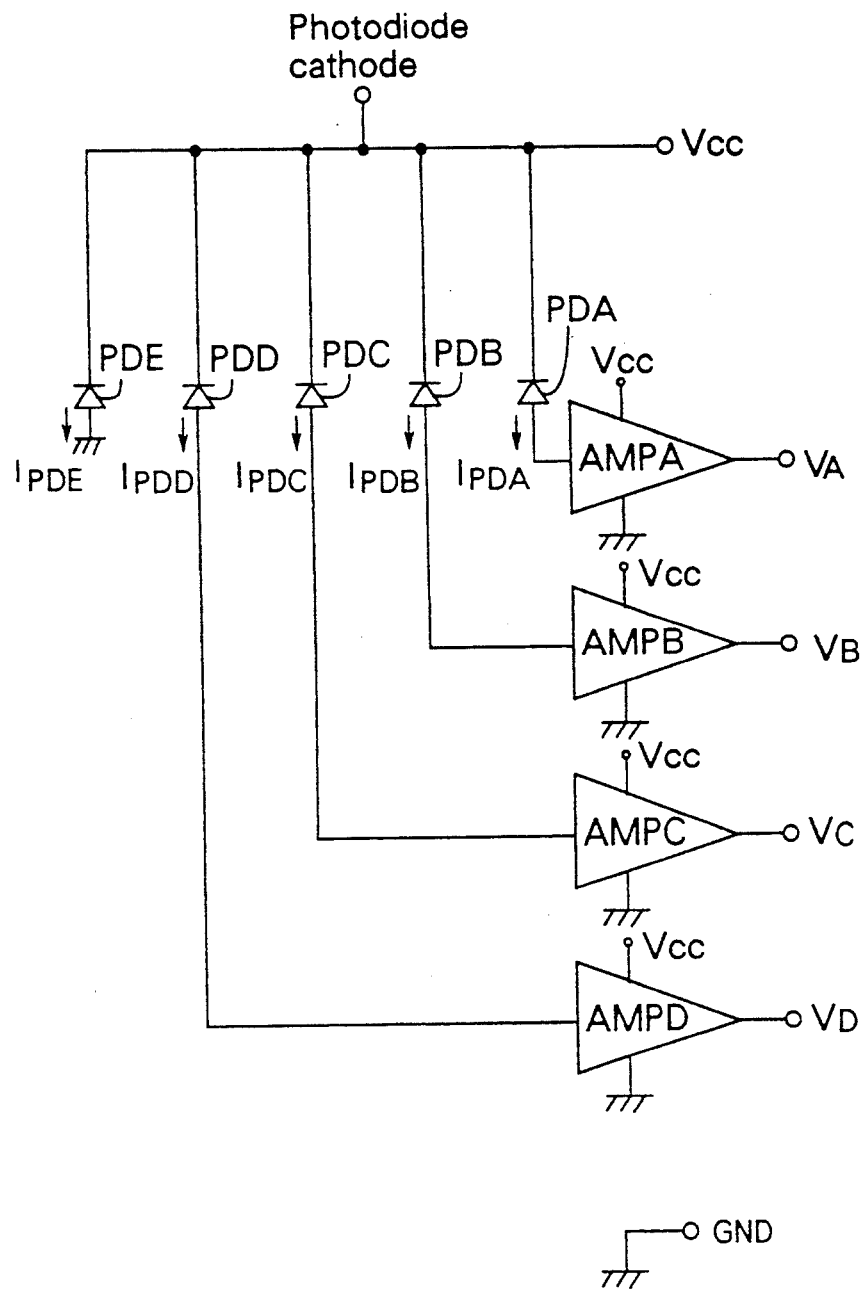
FIG. 7 is an equivalent circuit diagram of a conventional light-receiving and amplifying device.
Figure 8:
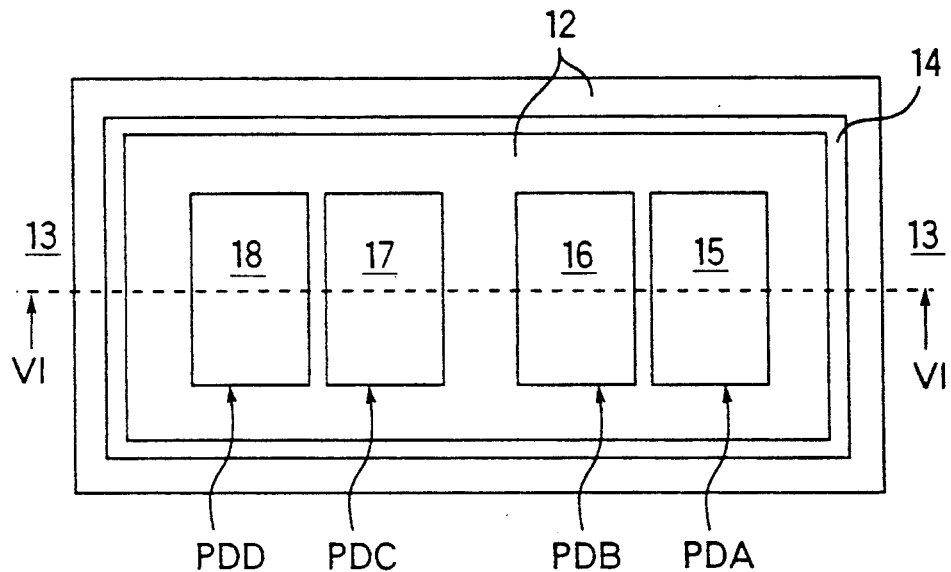
FIG. 8 is a pattern layout of photodiodes being constituent parts of the conventional light-receiving and amplifying device.
Figure 9:
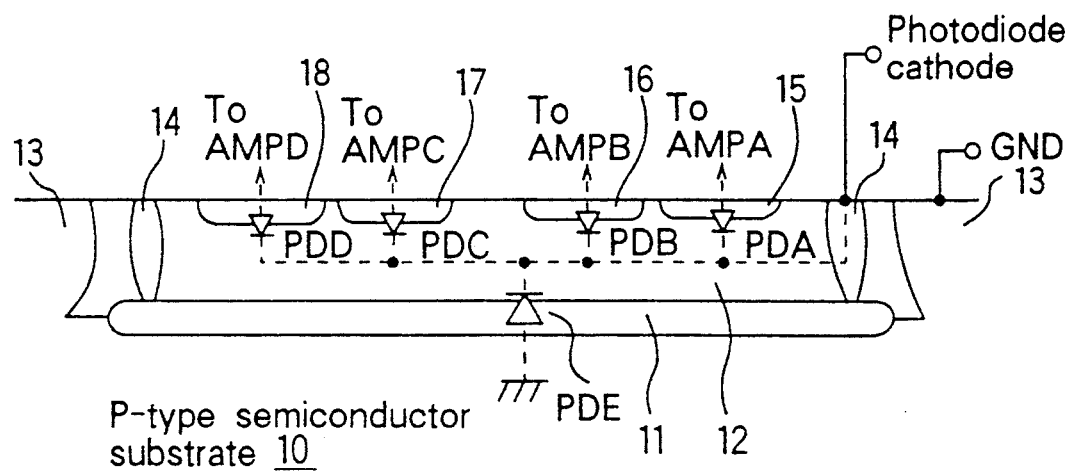
FIG. 9 is a cross-sectional view taken along the line VI—VI in FIG. 8.

FIG. 1 shows an equivalent circuit diagram of a light-receiving and amplifying device in accordance with an embodiment of the present invention. The light-receiving and amplifying device includes four photodiodes PDA, PDB, PDC, and PDD having a common cathode and four amplifier circuits AMPA, AMPB, AMPC, and AMPD in the same manner as the conventional one shown in FIG. 7. As illustrated in FIGS. 8 and 9, each of the photodiodes PDA, PDB, PDC, and PDD are fabricated by diffusing a P-type impurity on a surface of a N-type epitaxial layer (where PDE indicates a parasitic photodiode produced between the N-type epitaxial layer and the P-type semiconductor substrate). The amplifier circuits AMPA, AMPB, AMPC, and AMPD receive photocurrent signals $I_{PDA}$, $I_{PDB}$, $I_{PDC}$, and $I_{PDD}$ from the anodes of the photodiodes PDA, PDB, PDC, and PDD to amplify the signals and generate low-impedance voltage outputs $V_A$, $V_B$, $V_C$, and $V_D$.

A first current mirror circuit 1 is provided at the side of the cathode of the photodiodes PDA, PDB, PDC, and PDD, and a second current mirror circuit 2 is provided at the side of the anodes of the photodiodes PDA, PDB, PDC, and PDD. The first current mirror circuit 1 is composed of a PNP transistor Q1 serving as a third transistor and a PNP transistor Q2 serving as a fourth transistor. The emitter and base terminals of the transistor Q1 are connected respectively to the emitter and base terminals of the transistor Q2, and the emitter terminals are connected to a power source (electric potential: Vcc). The base and the collector of the transistor Q1 are connected to each other, and the collector of the transistor Q1 is connected to the common cathode of the photodiodes PDA, PDB, PDC, and PDD. With the above-mentioned arrangement, the first current mirror circuit 1 can output the current I2 having the same magnitude as that of the collector current I1 (i.e., the total of a summed current $I_{SUM}$ flowing through the photodiodes PDA, PDB, PDC, and PDD and a current $I_{PDE}$ flowing through the parasitic photodiode PDE) of the transistor Q1 at the collector of the transistor Q2. On the other hand, the aforementioned second current mirror circuit 2 is composed of an NPN transistor Q3 serving as a first transistor and NPN transistors Q4, Q5, Q6, and Q7 serving as a second transistor provided respectively for the photodiodes PDA, PDB, PDC, and PDD. The emitter and base terminals of the transistor Q3 are connected respectively to the emitter and base terminals of the transistors Q4, Q5, Q6, and Q7, and the emitter terminals are connected to a ground terminal GND. The base and collector terminals of the transistor Q3 are connected to each other, and the collector of the transistor Q3 is connected to the collector of the transistor Q2 of the first current mirror circuit 1. The collector terminals of the transistors Q4, Q5, Q6, and Q7 are connected respectively to the anodes of the photodiodes PDA, PDB, PDC, and PDD. The second current mirror circuit 2 receives at the transistor Q3 the current I2 output from the first current mirror circuit 1. The current I2 received at the transistor Q3 approximately equals the sum of collector currents I4, I5, I6, and I7 of the transistors Q4, Q5, Q6, and Q7 to allow the collector currents I4, I5, I6, and I7 to be removed respectively from the anodes of the photodiodes PDA, PDB, PDC, and PDD. The magnitudes of the collector currents I4, I5, I6, and I7 depend on the emitter area ratio of the transistors Q4, Q5, Q6, and Q7 to the transistor Q3.

Figure 2:
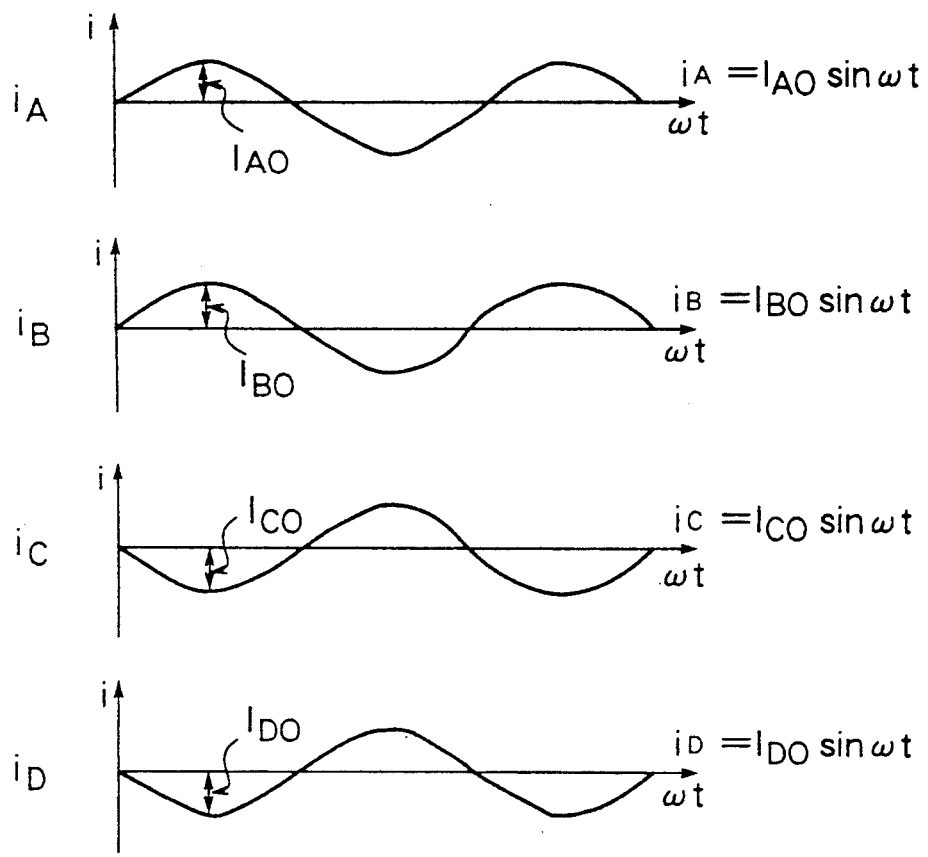
FIG. 2 is a chart of AC component waveforms of an audio signal of a disc.

The photocurrent signals $I_{PDA}$, $I_{PDB}$, $I_{PDC}$, and $I_{PDD}$ corresponding to an audio signal from a disc can be generally expressed as follows. Assuming that the DC components and the AC components contained in the photocurrent signals $I_{PDA}$, $I_{PDB}$, $I_{PDC}$, and $I_{PDD}$ are respectively $I_A$ and $i_A$; $I_B$ and $i_b$; $I_C$ and $i_c$; and $I_D$ and $i_d$, the photocurrent signals can be expressed as follows:

$$I_{PDA} = I_A + i_a = I_A + I_{AO}\sin\omega t \quad (1)$$
$$I_{PDB} = I_B + i_B = I_B + I_{BO}\sin\omega t \quad (2)$$
$$I_{PDC} = I_C + i_C = I_C - I_{CO}\sin\omega t \quad (3)$$
$$I_{PDD} = I_D + i_D = I_D - I_{DO}\sin\omega t \quad (4)$$

where $I_{AO}$, $I_{BO}$, $I_{CO}$, and $I_{DO}$ represent the amplitudes of the AC components, $\omega$ represents an angular frequency, and t represents the time as exemplified in FIG. 2.

Normally in the pickup, the following equations hold.

$$I_A \approx I_B \approx I_C \approx I_D \quad (5)$$

$$I_{AO} \approx I_{BO} \approx I_{CO} \approx I_{DO} \quad (6)$$

Therefore, since the AC components offset each other when the equations (5) and (6) are incorporated into the equations (1) through (4) and the photocurrent signals $I_{PDA}$, $I_{PDB}$, $I_{PDC}$, and $I_{PDD}$ of the photodiodes PDA, PDB, PDC, and PDD are summed, the summed current $I_{SUM}$ is expressed as:

$$I_{SUM} \approx I_A + I_B + I_C + I_D \approx 4I_A \quad (7)$$

which means that the current contains mostly the DC components (likewise the current $I_{PDE}$ flowing through the parasitic photodiode PDE contains mostly the DC components).

Consequently, the collector current I1 of the transistor Q1 of the first current mirror circuit 1 is as follows:

$$I1 \approx I_{SUM} + I_{PDE} \approx 4I_A + I_{PDE} \quad (8)$$

The current I2 output from the first current mirror circuit 1 is as follows:

$$I2 \approx I1 \approx 4I_A + I_{PDE} \quad (9)$$

In the above case, the emitter area ratio of the transistor Q3, Q4, Q5, Q6, and Q7 constituting the second current mirror circuit 2 is preliminarily set up as follows:

$$Q3{:}Q4{:}Q5{:}Q6{:}Q7 = (4I_A + I_{PDE}){:}I_A{:}I_A{:}I_A{:}I_A \quad (10)$$

With the above-mentioned arrangement, each of the currents I4, I5, I6, and I7 removed from the anodes of the photodiodes PDA, PDB, PDC, and PDD by the second current mirror circuit 2 is $I_A$. Consequently, currents $I_{INC}$, and $I_{IND}$ input to the amplifier circuits AMPA, AMPB, AMPC, and AMPD are as follows:

$$I_{INA} = I_{PDA} - I1 \approx I_A + I_{AO}\sin\omega t - I_A \approx I_{AO}\sin\omega t \quad (11)$$
$$I_{INB} = I_{PDB} - I6 \approx I_B + I_{BO}\sin\omega t - I_A \approx I_{BO}\sin\omega t \quad (12)$$
$$I_{INC} = I_{PDC} - I5 \approx I_C + I_{CO}\sin\omega t - I_A \approx -I_{CO}\sin\omega t \quad (13)$$
$$I_{IND} = I_{PDD} - I4 \approx I_D + I_{DO}\sin\omega t - I_A \approx -I_{DO}\sin\omega t \quad (14)$$

which means that mostly the AC components are contained. Therefore, the AC operation range can be widened.

Figure 3:
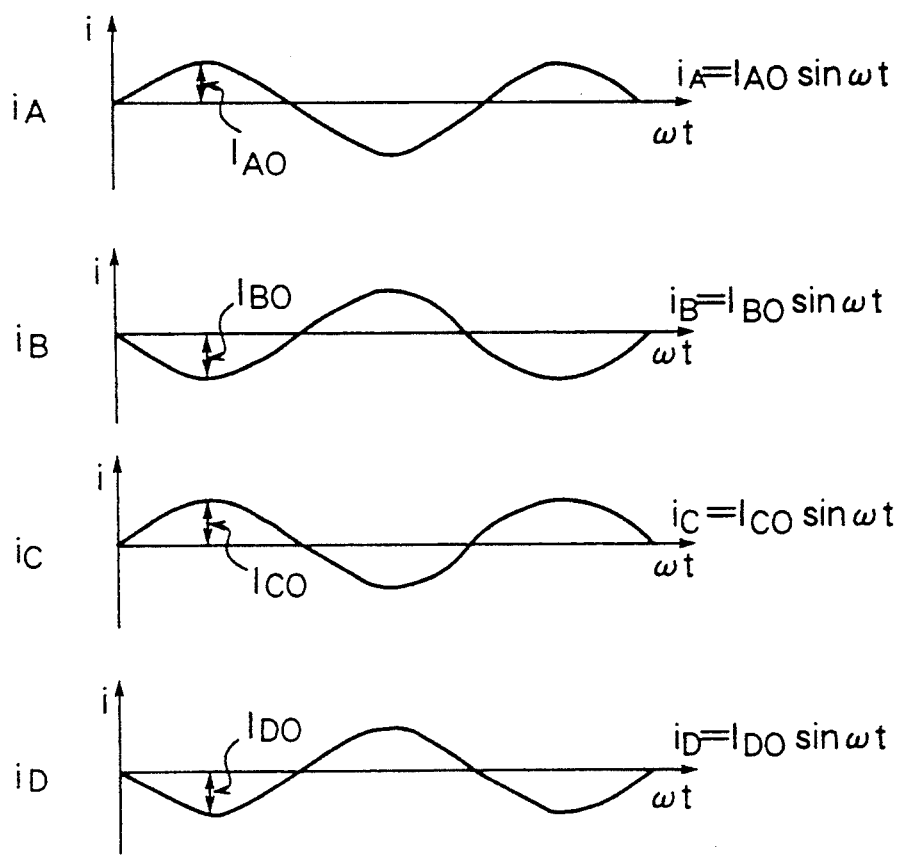
FIG. 3 is a chart of AC component waveforms of an address signal of a disc.

The photocurrent signals $I_{PDA}$, $I_{PDB}$, $I_{PDC}$, and $I_{PDD}$ corresponding to an address signal of the disc is expressed as follows. Assuming that the DC components and the AC components contained in the photocurrent signals $I_{PDA}$, $I_{PDB}$, $I_{PDC}$, and $I_{PDD}$ are respectively $I_A$ and $i_A$; $I_B$ and $i_B$; $I_C$ and $i_C$; and $I_D$ and $i_D$ in the same manner as in the equations (1) through (4), the photocurrent signals can be expressed as follows:

$$I_{PDA} = I_A + i_A = I_A + I_{AO}\sin\omega t \quad (15)$$
$$I_{PDB} = I_B + i_B = I_B - I_{BO}\sin\omega t \quad (16)$$
$$I_{PDC} = I_C + i_c = I_C + I_{CO}\sin\omega t \quad (17)$$
$$I_{PDD} = I_D + i_D = I_D - I_{DO}\sin\omega t \quad (18)$$

where $I_{AO}$, $I_{BO}$, $I_{CO}$, and $I_{DO}$ represent the amplitudes of the AC components, $\omega$ represents an angular frequency, and t represents the time as exemplified in FIG. 3.

Furthermore, for the same reason as in the case of audio signal, the following equations hold.

$$I_A \approx I_B \approx I_C \approx I_D \quad (5)$$

$$I_{AO} \approx I_{BO} \approx I_{CO} \approx I_{DO} \quad (6)$$

Therefore, since the AC components offset each other when the equations (5) and (6) are incorporated into the equations (15) through (18) and the photocurrent signals $I_{PDA}$, $I_{PDB}$, $I_{PDC}$, and $I_{PDD}$ of the photodiodes PDA, PDB, PDC, and PDD are summed, the summed current $I_{SUM}$ is expressed as:

$$I_{SUM} \approx I_A + I_B + I_C + I_D \approx 4I_A \quad (19)$$

which means that the current contains mostly the DC components (likewise the current $I_{PDE}$ flowing through the parasitic photodiode PDE contains mostly the DC components).

Consequently, the collector current I1 of the transistor Q1 of the first current mirror circuit 1 is as follows:

$$I1 \approx I_{SUM} + I_{PDE} \approx 4I_A + I_{PDE} \quad (20)$$

The current I2 output from the first current mirror circuit 1 is as follows:

$$I2 \approx I1 \approx 4I_A + I_{PDE} \quad (21)$$

In the above case, the emitter area ratio of the transistor Q3, Q4, Q5, Q6, and Q7 constituting the second current mirror circuit 2 is preliminarily set up as follows:

$$Q3{:}Q4{:}Q5{:}Q6{:}Q7 = (4I_A + I_{PDE}){:}I_A{:}I_A{:}I_A{:}I_A \quad (22)$$

With the above-mentioned arrangement, each of the currents I4, I5, I6, and I7 drawn from the anodes of the photodiodes PDA, PDB, PDC, and PDD by the second current mirror circuit 2 is $I_A$. Consequently, currents $I_{INA}$, $I_{INB}$, $I_{INC}$, and $I_{IND}$ input to the amplifier circuits AMPA, AMPB, AMPC, and AMPD are as follows:

$$I_{INA} = I_{PDA} - I7 \approx I_A + I_{A0}\sin\omega t - I_A \approx I_{A0}\sin\omega t \quad (23)$$
$$I_{INB} = I_{PDB} - I6 \approx I_B + I_{B0}\sin\omega t - I_A \approx - I_{B0}\sin\omega t \quad (24)$$
$$I_{INC} = I_{PDC} - I5 \approx I_C - I_{C0}\sin\omega t - I_A \approx I_{C0}\sin\omega t \quad (25)$$
$$I_{IND} = I_{PDD} - I4 \approx I_D - I_{D0}\sin\omega t - I_A \approx - I_{D0}\sin\omega t \quad (26)$$

which means that mostly the AC components are contained. Therefore, the AC operation range can be widened.

When the parasitic photodiode PDE is not existing or when the parasitic photodiode PDE exists but does not generate the photocurrent $I_{PDE}$, the aforementioned equations (11) through (14) and equations (23) through (26) hold utterly likewise by setting the value of the current $I_{PDE}$ to zero. Therefore, the AC operation range of the amplifier circuits can be widened in the same manner as in the case where the photocurrent $I_{PDE}$ is generated. In the above case, the emitter area ratio of the transistor Q3, Q4, Q5, Q6, and Q7 constituting the second current mirror circuit 2 is as follows:

$$Q3:Q4:Q5:Q6:Q7 = 4:1:1:1:1 \quad (27)$$

By fabricating on an identical semiconductor substrate the aforementioned photodiodes PDA, PDB, PDC, and PDD, amplifier circuits AMPA, AMPB, AMPC, and AMPD, first current mirror circuit 1, and second current mirror circuit 2, the entire device can be constructed compactly. Since the first current mirror circuit 1 and the second current mirror circuit 2 are composed only of NPN transistors and PNP transistors respectively, those circuits can be easily fabricated on an identical semiconductor substrate by the bipolar monolithic circuit integration technique.

Figure 4:
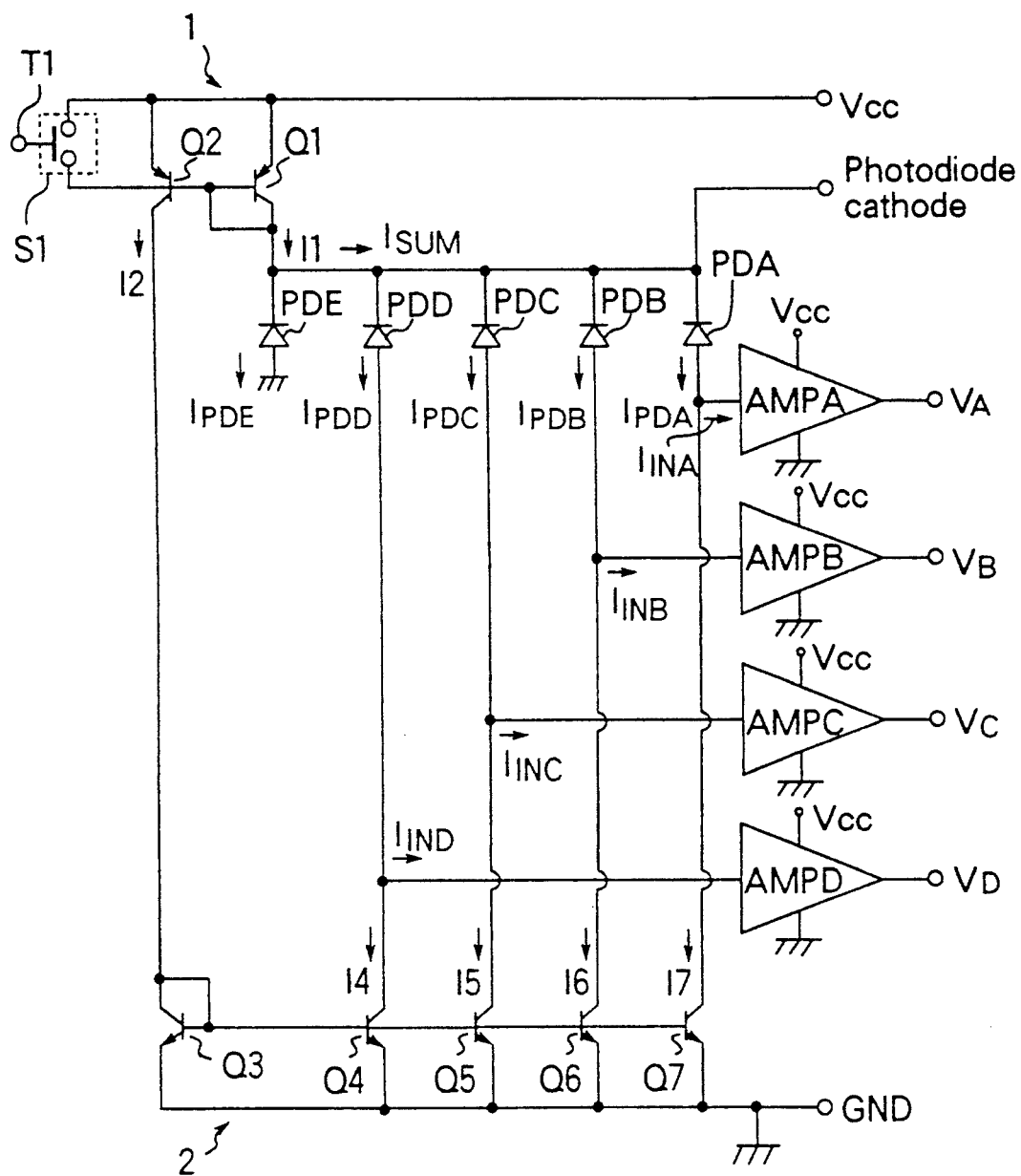
FIGS. 4, 10 and 11 are circuit diagrams of modifications of the light-receiving and amplifying device shown in FIG. 1.

FIG. 4 shows a modification of the aforementioned light-receiving and amplifying device. In the present embodiment, a switch S1 which can be externally controlled to be turned on and off is provided across the base terminals and emitter terminals of the transistors Q1 and Q2 of the first current mirror circuit 1. When the above-mentioned arrangement is selected, the first current mirror circuit 1 can be made to effect and stop its operation by externally applying a control signal to a control terminal T1 of the switch S1. In more detail, the switch S1 is turned off in the recording time. By so doing, the first current mirror circuit 1 operates in a manner as described above to allow the AC operation range of the amplifier circuits AMPA, AMPB, AMPC, and AMPD to be widened. In the above case, the quantity of light received by the photodiodes PDA, PDB, PDC, and PDD is great, and therefore the provision of the first and second current mirror circuits 1 and 2 does not matter in regard to the C-to-N ratio. In the playback time, the switch S1 is turned on. By so doing, the path across the base terminals and the emitter terminals of the transistors Q1 and Q2 is short-circuited to stop the operations of the transistors Q1 and Q2, with which the output current I2 of the first current mirror circuit 1 is made to be approximately zero. Therefore, the C-to-N ratio of the RF signal can be prevented from deteriorating to prevent the deterioration of the jitter characteristic. In the above case, the quantity of light received by the photodiodes PDA, PDB, PDC, and PDD is small, and therefore the AC operation range of each of the amplifier circuits AMPA, AMPB, AMPC, and AMPD is not required to be widened.

Figure 10:
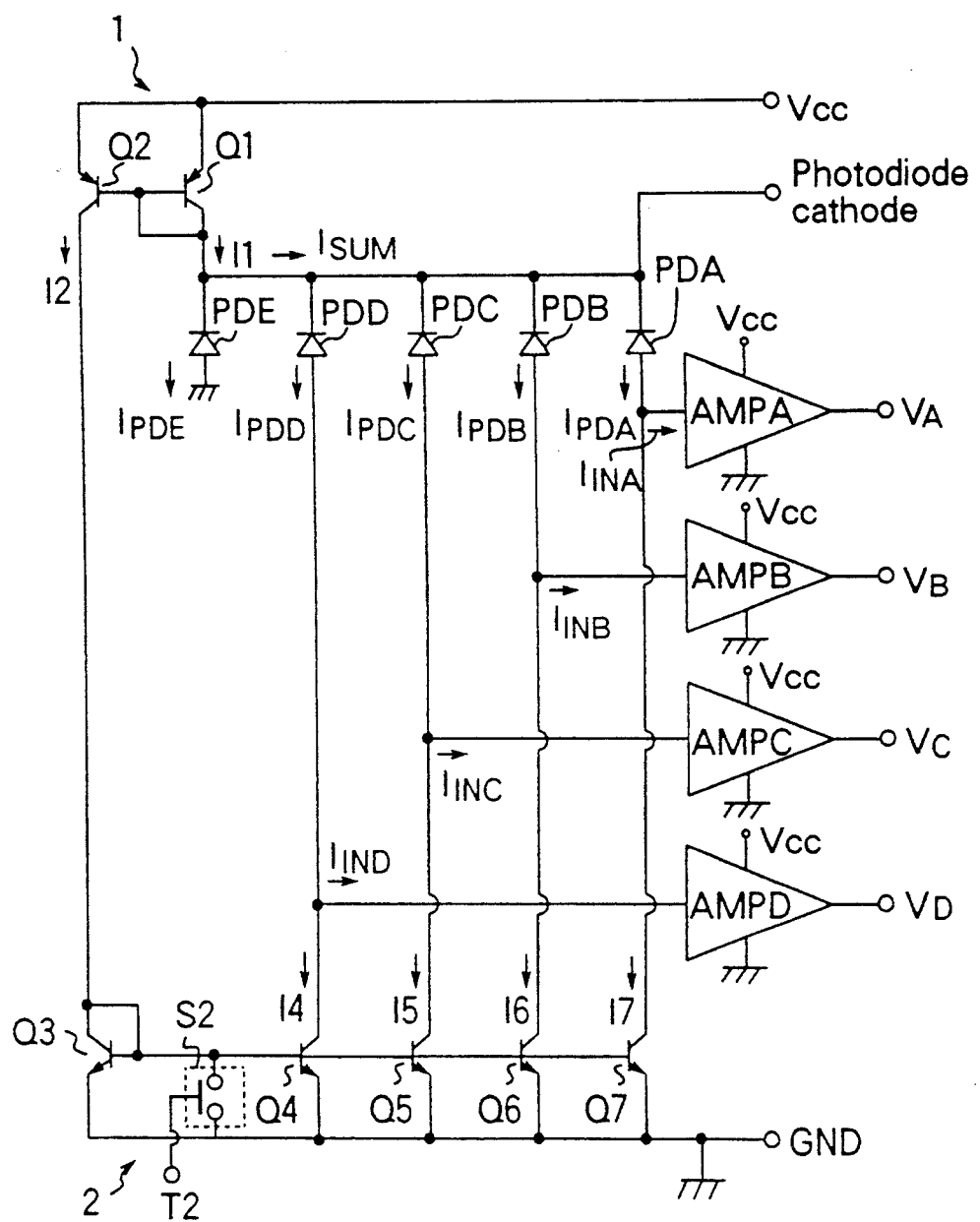

Referring to FIG. 10, a switch S2 is provided across the base terminals and the emitter terminals of the transistors Q3 through Q7 of the second current mirror circuit 2. In the above case, the second current mirror circuit 2 can be made to effect and stop its operation by turning on and off the switch. Therefore, by turning off the switch in the recording time and turning on the switch in the playback time, the AC operation range of the aforementioned amplifier circuits AMPA, AMPB, AMPC and AMPD can be widened in the recording time and the C-to-N ratio of the RF signal can be prevented from deteriorating in the playback time to prevent the deterioration of the jitter characteristic in the same manner as the aforementioned first current mirror circuit 1 is controlled to effect or stop its operation.

Figure 11:
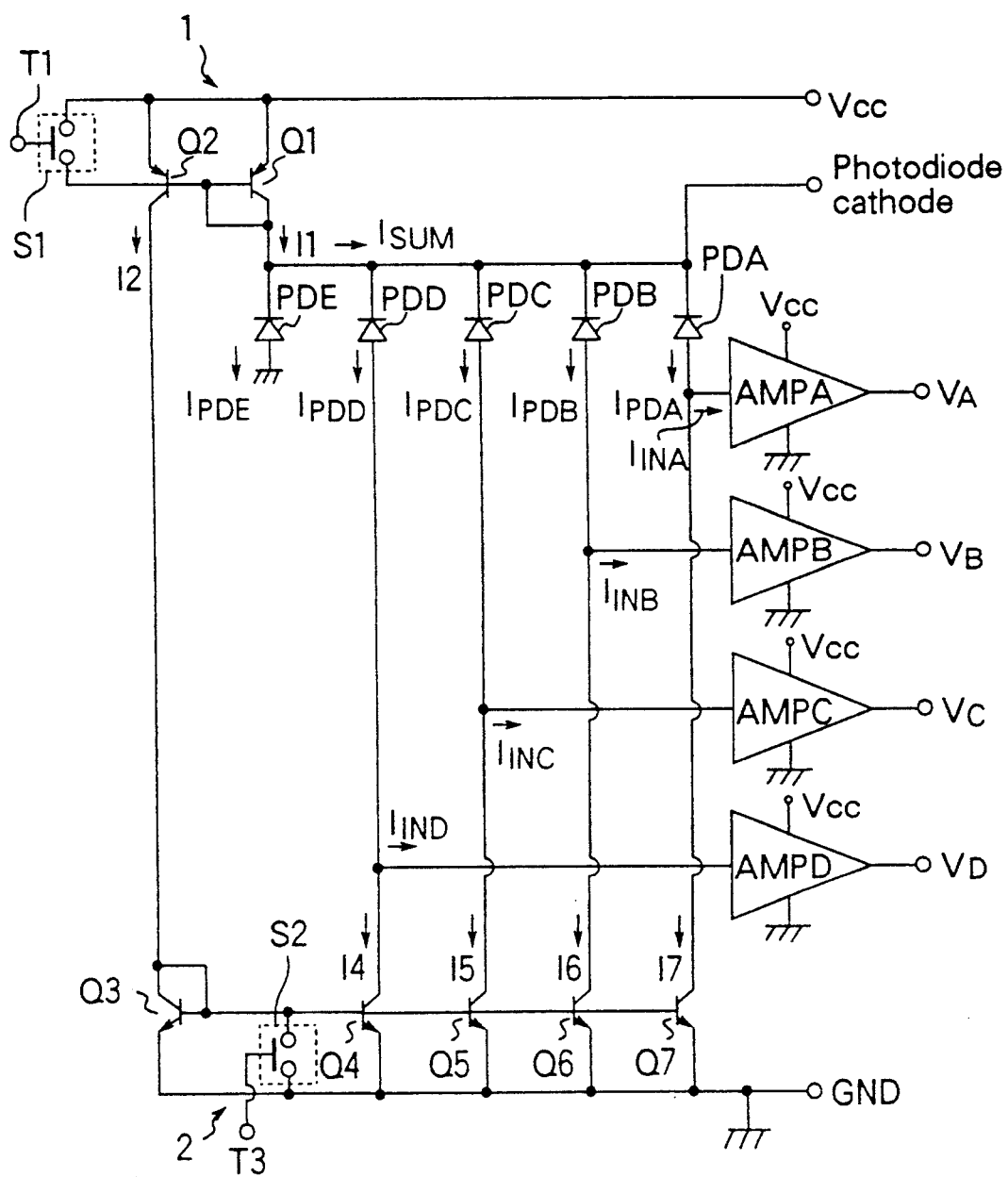

It is noted that as shown in FIG. 11, the same effect can be achieved when switches S1 and S2 are provided both across the base terminals and the emitter terminals of the transistors Q1 and Q2 and across the base terminals and the emitter terminals of the transistors Q3 through Q7.

Figure 5:
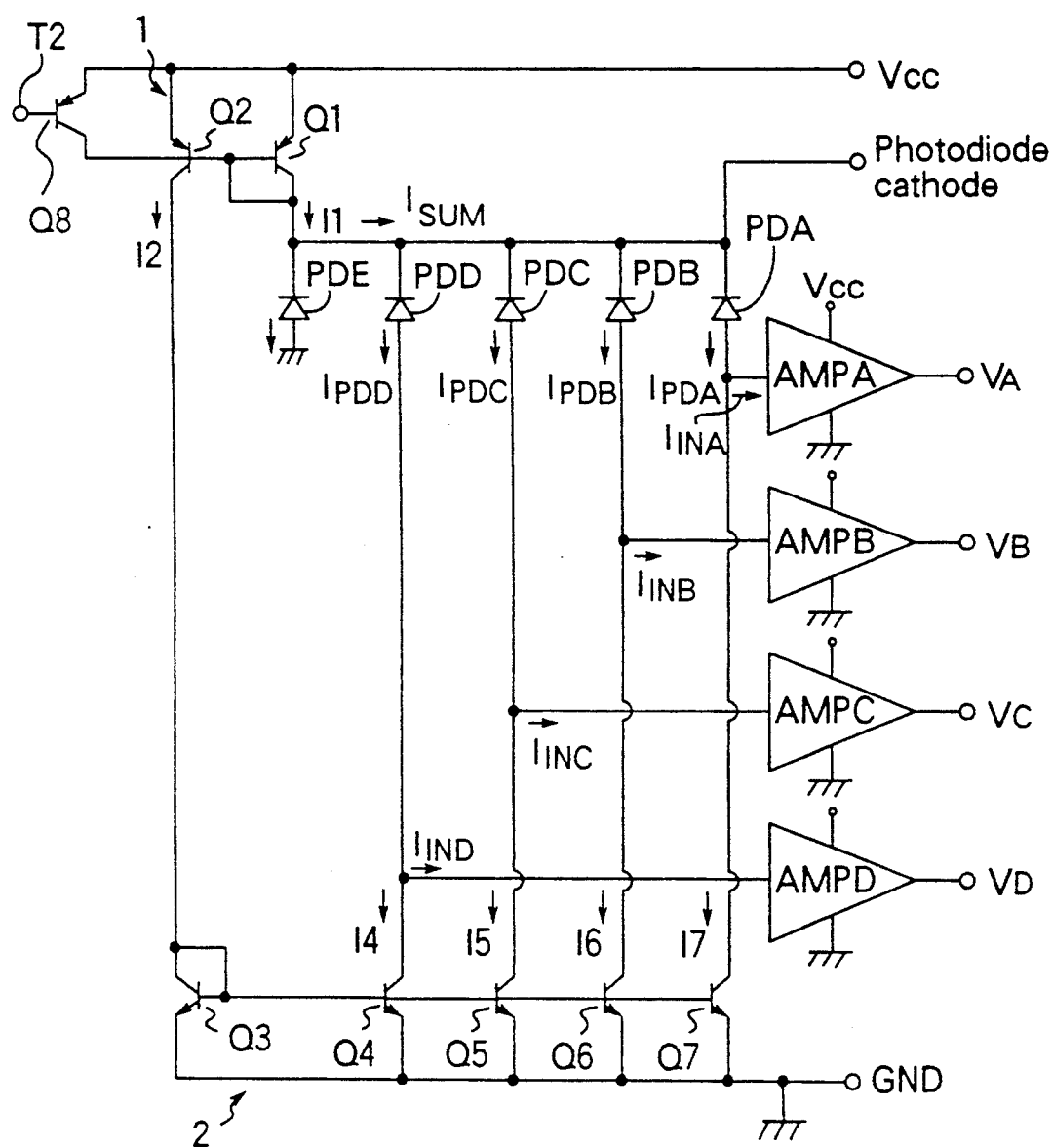
FIGS. 5, 12 and 13 are circuit diagrams of the other modifications of the light-receiving and amplifying device shown in FIG. 1.

FIG. 5 shows an embodiment in which the aforementioned switch S1 is composed of a PNP transistor Q8. In the present embodiment, the first current mirror circuit 1 can be made to effect and stop its operation by controlling the base current of the transistor Q8 via a control terminal T2. In more detail, no base current is formed through the transistor Q8 in the recording time to cut off the transistor Q8 to thereby increase the impedance across the base terminals and the emitter terminals of the transistors Q1 and Q2. By so doing, the first current mirror circuit 1 operates in a manner as described above to allow the AC operation range of the amplifier circuits AMPA, AMPB, AMPC and AMPD to be widened. In the playback time, a sufficient base current is formed through the transistor Q8 to put the transistor Q8 in a saturated condition (the voltage across the base and the collector is not higher then 0.2 V). By so doing, the voltage across the base terminals and the emitter terminals of the transistors Q1 and Q2 is made to be not higher than 0.2 V, with which the transistors Q1 and Q2 stops their operations to make the output current I2 of the first current mirror circuit 1 be approximately zero. Therefore, the C-to-N ratio of the RF signal can be prevented from deteriorating to prevent the deterioration of the jitter characteristic.

In the above case, the transistor Q8 can be fabricated simultaneously with the other components in a specified production process to allow easy provision of the transistor.

Figure 12:
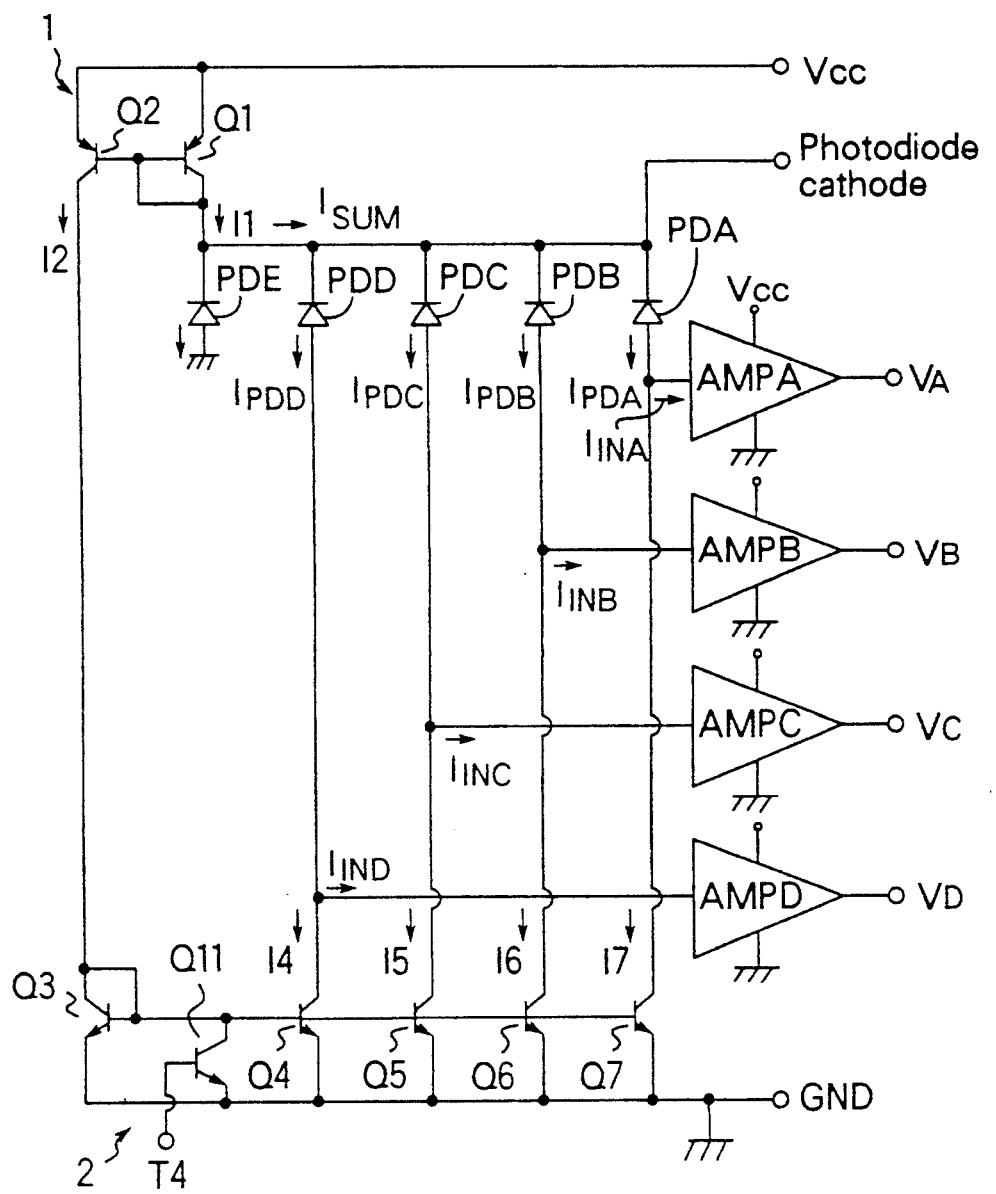
Figure 13:
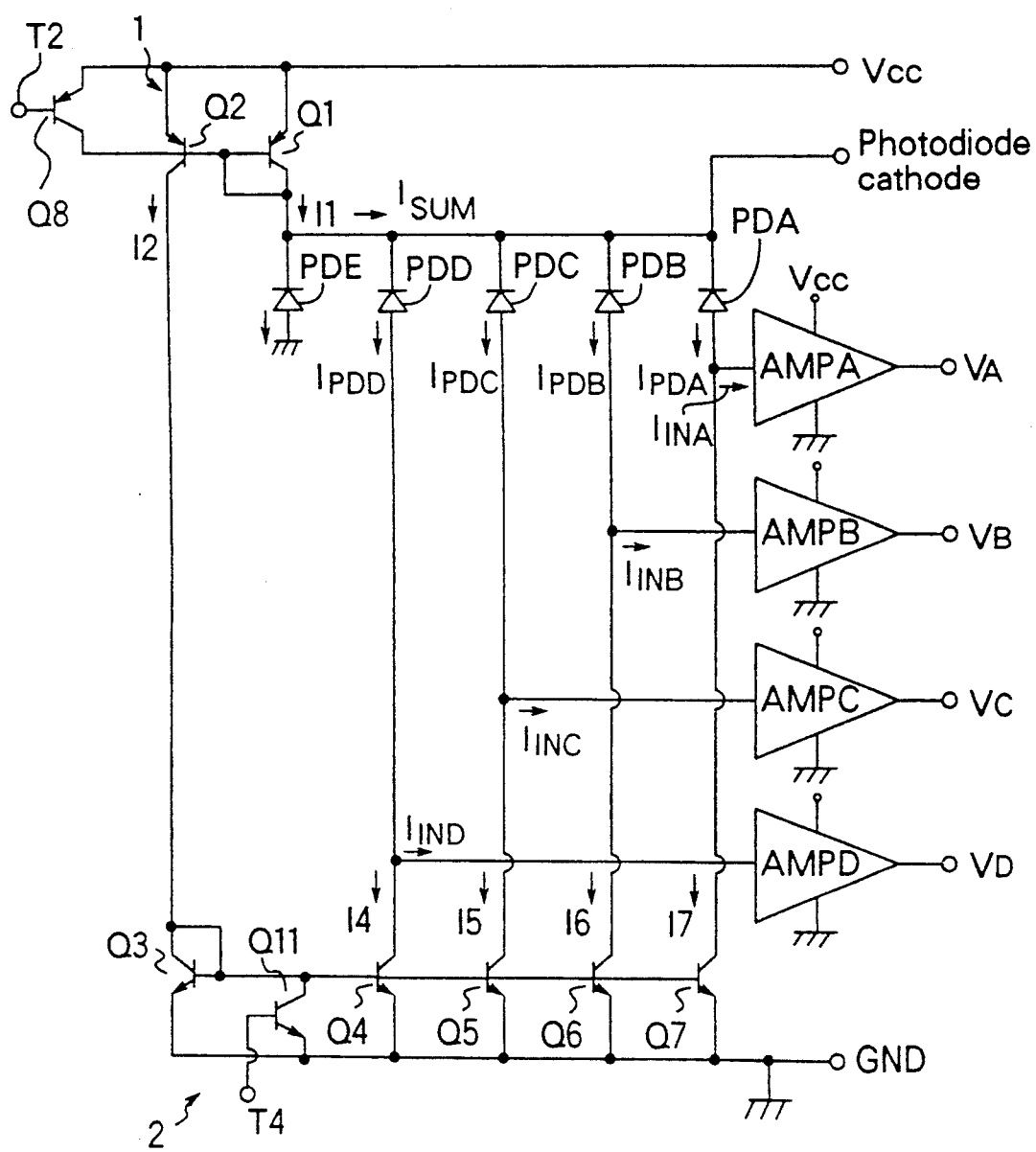

FIGS. 12 and 13 show embodiments which respectively have transistors Q11; Q8 and Q11 instead of the switches S2; S2 and S1 of FIGS. 10 and 11.

Figure 6:
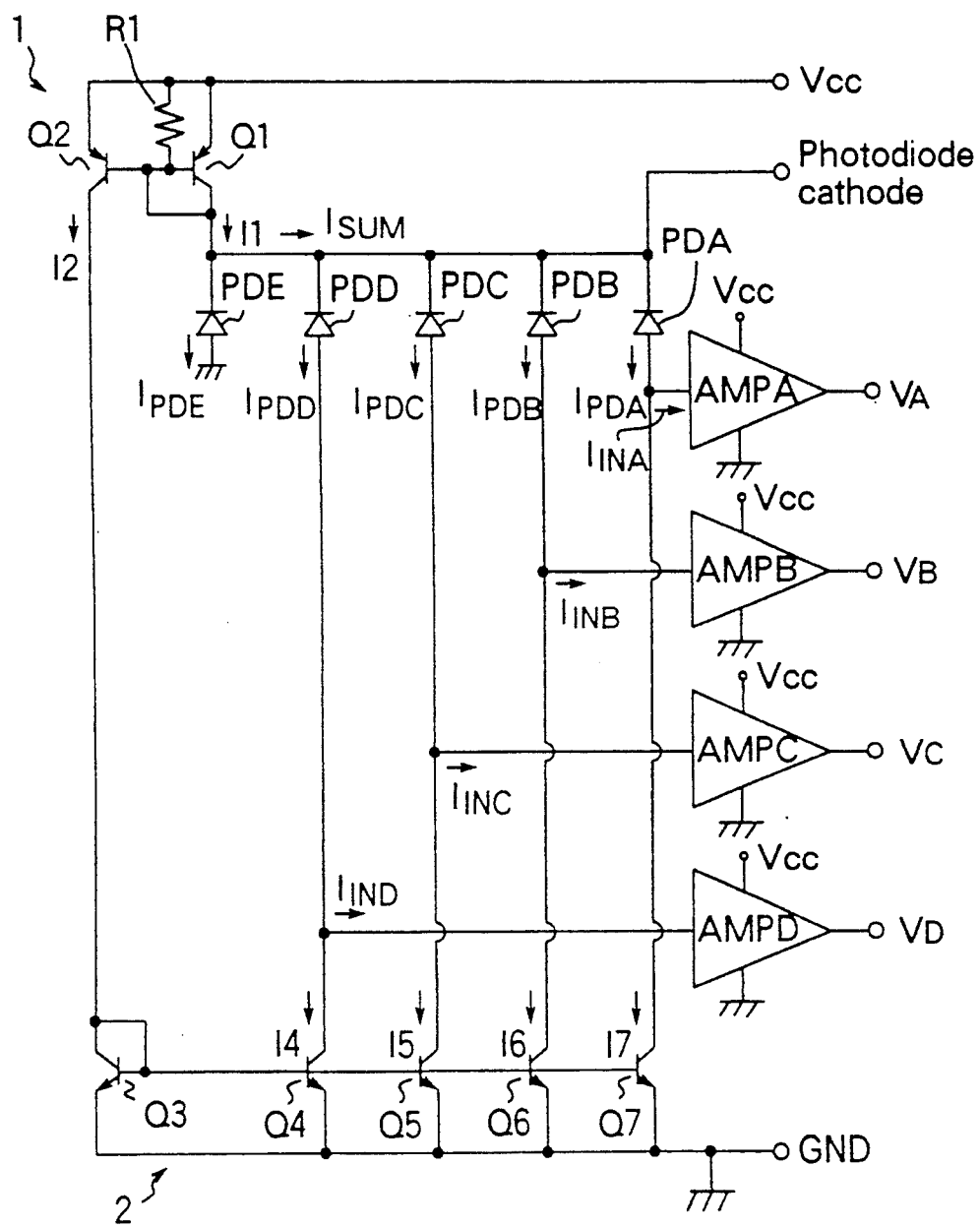
FIGS. 6, 14 and 15 are circuit diagrams of the other modifications of the light-receiving and amplifying device shown in FIG. 1.

FIG. 6 shows an embodiment in which an electric resistor R1 having a specified resistance value R1 is provided across the base terminals and the emitter terminals of the transistors Q1 and Q2 of the first current mirror circuit 1. It is now assumed that each of the transistors Q1 and Q2 has a cutoff voltage of $V_{BE}$ (about 0.5 V).

When the quantity of light received by the photodiodes PDA, PDB, PDC, and PDD is sufficiently great in the recording time and therefore the current I1 received from the first current mirror circuit 1 by the cathode of the photodiodes satisfies the condition as follows:

$$I1 > V_{BE}/R1$$

the output current I2 of the first current mirror circuit 1 is:

$$I2 \approx I1 - V_{BE}/R$$

The second current mirror circuit 2 generates currents I4, I5, I6, and I7 each having an even magnitude for each of the photodiodes PDA, PDB, PDC, and PDD, and removes the currents I4, I5, I6, and I7 having the even magnitude from the anodes of the photodiodes PDA, PDB, PDC, and PDD. Each of the currents I4, I5, I6 and I7 equals one fourth of the current I2. By so doing, the DC components contained in the currents $I_{INA}$, $I_{INB}$, $I_{INC}$, and $I_{IND}$ input to the amplifier circuits AMPA, AMPB, AMPC, and AMPD are reduced to increase the rate of the AC components. Therefore, the AC operation range of the amplifier circuits AMPA, AMPB, AMPC and AMPD can be widened in comparison with the conventional case. When the quantity of light received by the photodiodes PDA, PDB, PDC, and PDD is small in the playback time and therefore the current I1 flowing from the aforementioned first current mirror circuit 1 to the cathodes of the photodiodes satisfies the condition as follows:

$$I1 \leq V_{BE}/R1$$

the transistors Q1 and Q2 are cut off. Then the output current I2 of the first current mirror circuit 1 is:

$$I2 \approx 0$$

which means that the first and second current mirror circuits 1 and 2 stop their operation. Therefore, the C-to-N ratio of the RF signal is prevented from deteriorating to prevent the deterioration of the jitter characteristic.

Figure 14:
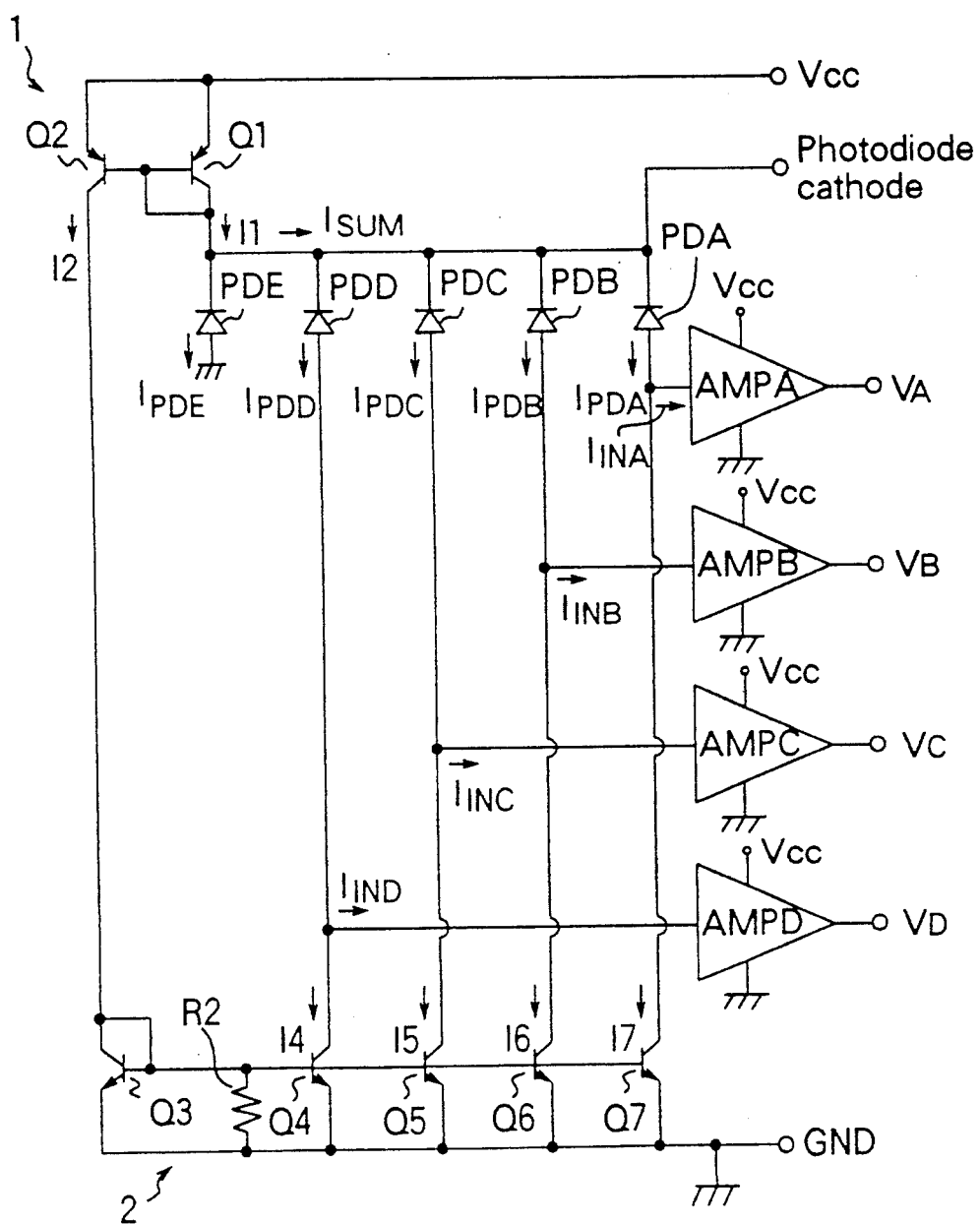

Referring to FIG. 14, an electric resistor R2 is provided across the base terminals and the emitter terminals of the transistors Q3 through Q7. In the above case, the second current mirror circuit 2 can be made to effect or stop its operation according to the quantity of light received by the photodiodes PDA, PDB, PDC, and PDD. Therefore, the AC operation range of the amplifier circuits AMPA, AMPB, AMPC and AMPD can be widened in the recording time and the C-to-N ratio of the RF signal can be prevented from deteriorating in the playback time to prevent the deterioration of the jitter characteristic in the same manner as the aforementioned first current mirror circuit 1 is controlled to effect or stop its operation.

Figure 15:
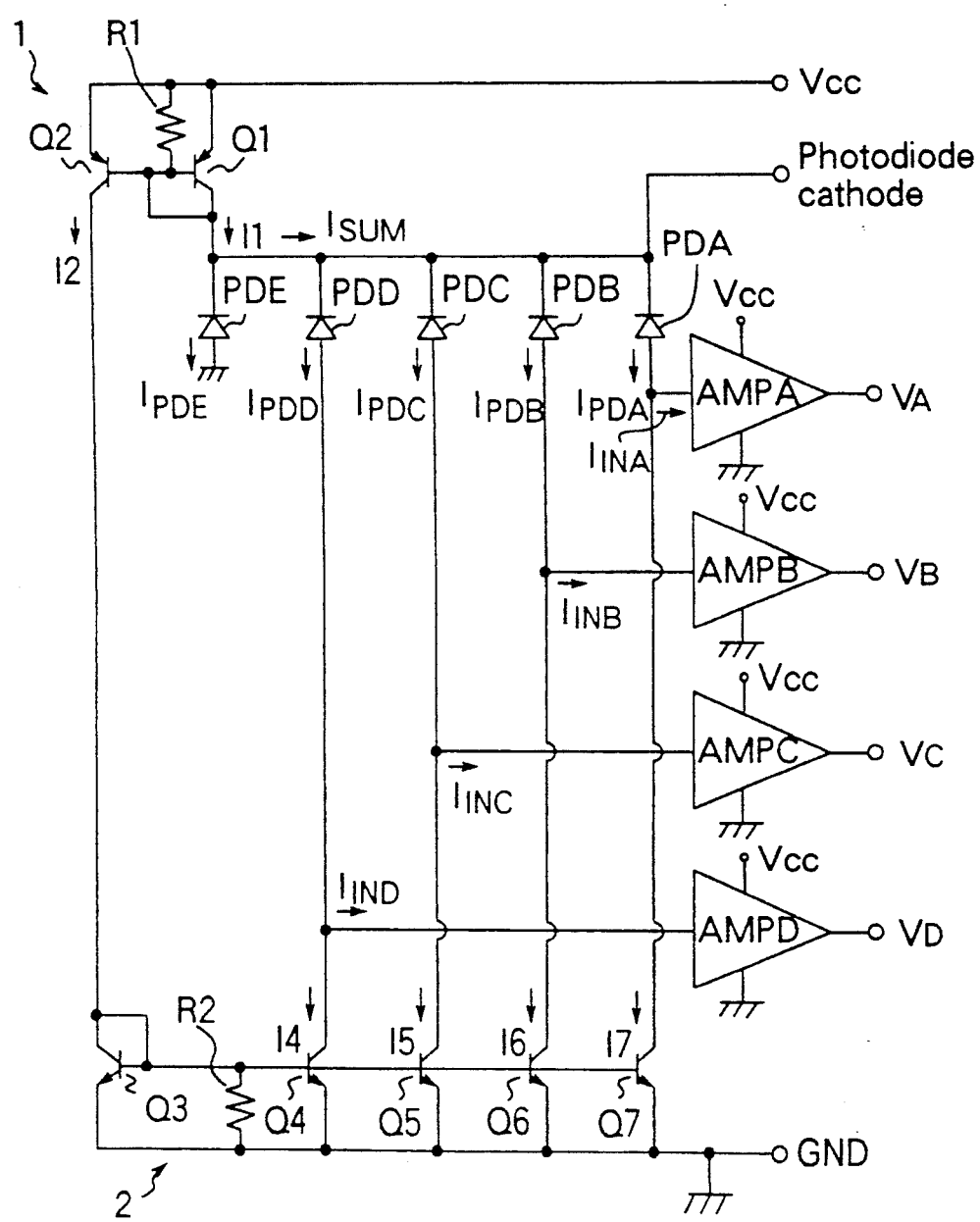

Also, as shown in FIG. 15, electric resistors R1 and R2 are provided both across the base terminals and the emitter terminals of the transistors Q1 and Q2 and across the base terminals and the emitter terminals of the transistors Q3 through Q7. Then, the AC operation range of the amplifier circuits AMPA, AMPB, AMPC and AMPD can be widened in the recording time and the C-to-N ratio of the RF signal can be prevented from deteriorating in the playback time to prevent the deterioration of the jitter characteristic.

As apparent in the above description of the light-receiving and amplifying device of the present invention, the first and second currents respectively equivalent to the sum of the currents flowing through the cathodes of the photodiodes are output from the first current mirror circuit. Then the second current mirror circuit receives the second currents and removes divided currents having an even magnitude from the anodes of the photodiodes. The sum of the divided currents approximately equal the second currents. By so doing, the DC components contained in the current input to the amplifier circuits are reduced to increase the rate of the AC components. Therefore, the AC operation range of each of the amplifier circuits is widened in comparison with the conventional case. The above-mentioned current mirror circuits can be each composed only of transistors without such a device as a capacitor having a large capacitance. Therefore, according to the present invention, a light-receiving and amplifying device can be produced in a simple manner at a low cost without dimensional increase of the device.

When the photodiodes are provided with the anodes thereof formed by diffusing an impurity on the surface of the semiconductor layer to be a common cathode, the photodiodes can be fabricated in a small area on a semiconductor substrate.

When the above-mentioned photodiodes and amplifier circuits are fabricated on an identical semiconductor substrate, the entire device can be constructed compactly.

The aforementioned second current mirror circuit includes the first transistor for receiving the second current from the aforementioned first current mirror circuit and a second transistor provided for each of the photodiodes with its base and emitter terminals connected respectively to the base and emitter of the first transistor. When the ratio of the emitter area of the first transistor to the emitter area of the second transistor is set at a specified ratio, the level of the current to be removed from the anode of each of the photodiodes can be adjusted. Therefore, the current input to the aforementioned amplifier circuits can be mostly the AC components to further widen the AC operation range.

The aforementioned first current mirror circuit includes the third transistor for supplying the first current to the cathodes of the photodiodes and a fourth transistor provided with its base and emitter terminals connected respectively to the base and emitter terminals of the third transistor to output from its collector the second current having the same magnitude as that of the first current output from the third transistor. When a switch which can be externally controlled to be turned on and off is connected across the base terminals and the emitter terminals of the third and fourth transistors and/or across the base terminals and the emitter terminals of the first and second transistors, the first and second current mirror circuits can be controlled to effect and stop their operation by external control signals. In the above case, the above-mentioned switch is turned off in the recording time to make the first current mirror circuit operate to allow the AC operation range of the amplifier circuits to be widened. In the playback time, the aforementioned switch is turned on to stop the operation of the first current mirror circuit (the output current is made to be approximately zero), with which the C-to-N ratio of the RF signal can be prevented from deteriorating to prevent the deterioration of the jitter characteristic. When a switch is provided across the base terminals and the emitter terminals of the first and second transistors, the second current mirror circuit is made to effect or stop its operation by turning on or off the switch. Therefore, by turning off the switch in the recording time and turning on the switch in the playback time, the AC operation range of the amplifier circuits can be widened in the recording time and the C-to-N ratio of the RF signal can be prevented from deteriorating in the playback time to prevent the deterioration of the jitter characteristic in the same manner as the aforementioned first current mirror circuit is controlled to effect or stop its operation. When switch units are provided both across the base terminals and the emitter terminals of the third and fourth transistors and across the base terminals and the emitter terminals of the first and second transistors, the AC operation range of each of the amplifier circuits is of course widened in the recording time, and the C-to-N ratio of the RF signal is prevented from deteriorating in the playback time to prevent the deterioration of the jitter characteristic.

When the above-mentioned switch is composed of a transistor, the switch can be fabricated simultaneously with the other constituent parts by a specified production process, which means that the switch can be provided in a simple manner.

When an electric resistor having a specified resistance value is connected across the base terminals and the emitter terminals of the third and fourth transistors instead of the above-mentioned switch, the first current mirror circuit can be made to effect or stop its operation according to the quantity of light received by the aforementioned photodiodes. Therefore, the AC operation range of the amplifier circuits can be widened in the recording time, and the C-to-N ratio of the RF signal can be prevented from deteriorating in the playback time to prevent the deterioration of the jitter characteristic. When an electric resistor is provided across the base terminals and the emitter terminals of the first and second transistors, the second current mirror circuit can be made to effect or stop its operation according to the quantity of light received by the aforementioned photodiodes. Therefore, the AC operation range of each of the amplifier circuits can be widened in the recording time, and the C-to-N ratio of the RF signal can be prevented from deteriorating in the playback time to prevent the deterioration of the jitter characteristic in the same manner as the aforementioned first current mirror circuit is controlled to effect or stop its operation. When electric resistors are provided both across the base terminals and the emitter terminals of the third and fourth transistors and across the base terminals and the emitter terminals of the first and second transistors, the AC operation range of each of the amplifier circuits can be of course widened in the recording time, and the C-to-N ratio of the RF signal is prevented from deteriorating in the playback time to prevent the deterioration of the jitter characteristic.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light-receiving and amplifying device having a plurality of photodiodes which generate current signals according to received light and amplifier circuits which are connected to anodes of the photodiodes to amplify the current signals generated by the photodiodes, the light-receiving and amplifying device comprising:
   a first current mirror circuit which is connected to cathodes of the photodiodes and outputs a first current having magnitude of at least a sum of currents flowing through the cathodes and outputs a second current having the same magnitude as the magnitude of the first current; and
   a second current mirror circuit which receives the second current output from the first current mirror circuit and receives divided currents each having equal magnitude from the anodes of the photodiodes.

2. A light-receiving and amplifying device as claimed in claim 1, wherein the photodiodes have the anodes thereof formed by diffusing an impurity on a surface of a semiconductor layer to be a common cathode.

3. A light-receiving and amplifying device as claimed in claim 1, wherein the photodiodes and the amplifier circuits are formed on an identical semiconductor substrate.

4. A light-receiving and amplifying device as claimed in claim 2, wherein the photodiodes and the amplifier circuits are formed on an identical semiconductor substrate.

5. A light-receiving and amplifying device as claimed in claim 1, wherein the second current mirror circuit comprises a first transistor which receives the second current from the first current mirror circuit and a second transistor which is provided for each of the photodiodes with its base and emitter terminals connected respectively to base and emitter terminals of the first transistor, and
   the ratio of an emitter area of the first transistor to an emitter area of the second transistor is set at a specified ratio.

6. A light-receiving and amplifying device as claimed in claim 2, wherein the second current mirror circuit comprises a first transistor which receives the second current from the first current mirror circuit and a second transistor which is provided for each of the photodiodes with its base and emitter terminals connected respectively to base and emitter terminals of the first transistor, and
   the ratio of an emitter area of the first transistor to an emitter area of the second transistor is set at a specified ratio.

7. A light-receiving and amplifying device as claimed in claim 3, wherein the second current mirror circuit comprises a first transistor which receives the second current from the first current mirror circuit and a second transistor which is provided for each of the photodiodes with its base and emitter terminals connected respectively to base and emitter terminals of the first transistor, and
   the ratio of an emitter area of the first transistor to an emitter area of the second transistor is set at a specified ratio.

8. A light-receiving and amplifying device as claimed in claim 4, wherein the second current mirror circuit comprises a first transistor which receives the second current from the first current mirror circuit and a second transistor which is provided for each of the photodiodes with its base and emitter terminals connected respectively to base and emitter terminals of the first transistor, and the ratio of an emitter area of the first transistor to an emitter area of the second transistor is set at a specified ratio.

9. A light-receiving and amplifying device as claimed in of claim 1, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

10. A light-receiving and amplifying device as claimed in of claim 2, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

11. A light-receiving and amplifying device as claimed in of claim 3, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

12. A light-receiving and amplifying device as claimed in of claim 4, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

13. A light-receiving and amplifying device as claimed in of claim 5, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

14. A light-receiving and amplifying device as claimed in of claim 6, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

15. A light-receiving and amplifying device as claimed in of claim 7, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

16. A light-receiving and amplifying device as claimed in of claim 8, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current output by the third transistor, and a switch which can be externally controlled to be turned on and off is connected across the base terminals and the emitter terminals of the third and fourth transistors and/or across the base terminals and the emitter terminals of the first and second transistors.

17. A light-receiving and amplifying device as claimed in claim 9, wherein the switch is composed of a transistor.

18. A light-receiving and amplifying device as claimed in claim 1, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

19. A light-receiving and amplifying device as claimed in claim 2, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

20. A light-receiving and amplifying device as claimed in claim 3, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

21. A light-receiving and amplifying device as claimed in claim 4, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

22. A light-receiving and amplifying device as claimed in claim 5, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

23. A light-receiving and amplifying device as claimed in claim 6, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

24. A light-receiving and amplifying device as claimed in claim 7, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

25. A light-receiving and amplifying device as claimed in claim 8, wherein the first current mirror circuit comprises a third transistor which outputs the first current to the cathodes of the photodiodes and a fourth transistor of which base and emitter terminals are connected respectively to the base and emitter terminals of the third transistor to output from its collector the second current having the same magnitude as the magnitude of the first current, and an electric resistor having a specified resistance value is connected across the base terminals and the emitter terminals of the third and fourth transistors and/or across the base terminals and the emitter terminals of the first and second transistors.

* * * * *